(12) United States Patent
Lu

(10) Patent No.: US 7,778,375 B2
(45) Date of Patent: Aug. 17, 2010

(54) CLOCK GENERATOR AND DATA RECOVERY CIRCUIT USING THE SAME

(75) Inventor: Chao-Hsin Lu, Ta Yuan Hsiang (TW)

(73) Assignee: Realtek Semiconductor Corp., Hsinchu (TW)

( * ) Notice: Subject to any disclaimer, the term of this patent is extended or adjusted under 35 U.S.C. 154(b) by 845 days.

(21) Appl. No.: 11/246,090

(22) Filed: Oct. 11, 2005

(65) Prior Publication Data

US 2006/0078079 A1    Apr. 13, 2006

(30) Foreign Application Priority Data

Oct. 11, 2004    (TW) ............... 93130780 A

(51) Int. Cl.
 H03D 3/24    (2006.01)
(52) U.S. Cl. .............................. 375/375
(58) Field of Classification Search ................. 375/375
    See application file for complete search history.

(56) References Cited

U.S. PATENT DOCUMENTS

2004/0201428 A1* 10/2004 Kenney et al. ................ 331/16

OTHER PUBLICATIONS

Patrik Larsson, A 2-1600-MHz CMOS Clock Recovery PLL with Low-Vdd Capability, IEEE, 1999.*
Patrik Larsson, IEEE Journal of Solid-State Circuits, vol. 34, No. 12, Dec. 1999, pp. 1951-1960.

* cited by examiner

*Primary Examiner*—David C Payne
*Assistant Examiner*—Tanmay K Shah
(74) *Attorney, Agent, or Firm*—Thomas, Kayden, Horstemeyer & Risley, LLP

(57) ABSTRACT

A clock generator and a data recovery circuit. The clock generator includes a voltage control oscillator (VCO) for generating a sampling clock and multi-phase clocks, a multiplexer for receiving the multi-phase clocks and selecting one of the multi-phase clocks to generate a selected clock according to a selection signal, a phase-frequency detector for receiving the selected clock and a reference clock and generating a phase-frequency error signal, a charge pump and loop filter for receiving the phase-frequency error signal and generating a control voltage, a phase detector for receiving the sampling clock and an input signal and generating a phase error signal, and a digital low-pass filter for receiving the phase error signal and generating the selection signal. The digital low-pass filter clears an accumulated phase error when it generates the selection signal to force the multiplexer to change the phase.

16 Claims, 5 Drawing Sheets

CLOCK GENERATOR AND DATA RECOVERY CIRCUIT USING THE SAME

This application claims the benefit of the filing date of Taiwan Application Ser. No. 093130780, filed on Oct. 11, 2004, the content of which is incorporated herein by reference.

BACKGROUND OF THE INVENTION

1. Field of the Invention

The invention relates to clock generation, and more particularly, to a data recovery circuit with a clock generator.

2. Description of the Related Art

In data interfaces of digital televisions, such as those of Digital Visual Interface (DVI) or of High-Definition Multimedia Interface (HDMI), data recovery circuits is generally used to recover data in a serial signal comprising the red (R), green (G), and blue (B) video data. Data recovery circuits typically can be categorized into feedback-based data recovery scheme or feedforward-based data recovery scheme.

FIG. 1 shows the architecture of a feedback-based data recovery circuit. Referring to FIG. 1, the feedback-based data recovery circuit 10 includes a clock generating unit 11 and a phase detecting and sampling unit 12. The clock generating unit 11 receives a reference clock signal and then generates a plurality of multi-phase clock signals (or a single phase clock signal). The phase detecting and sampling unit 12 receives an input signal, and generates an output signal and a phase adjustment signal according to the multi-phase clock signals. The clock generating unit 11 adjusts the phases of the multi-phase clock signals according to the phase adjustment signal. The clock generating unit 11 may be implemented with a phase locked loop (PLL), a delay locked loop (DLL), a delay unit, or the like. Therefore, the feedback-based data recovery circuit 10 first generates the output signal, and then generates the phase adjustment signal according to the state of the output signal.

FIG. 2 shows the architecture of a feedforward-based data recovery circuit. Referring to FIG. 2, the feedforward-based data recovery circuit 20 includes a clock generating unit 21, an over-sampling unit 22, an optimum phase detecting unit 23, and a multiplexer (MUX) 24. The clock generating unit 21 receives a reference clock signal, and then generates a plurality of multi-phase sampling clock signals. The over-sampling unit 22 receives an input signal, over-samples the input signal according to the multi-phase sampling clock signals, and thus generates sampled signals. The optimum phase detecting unit 23 generates a selection signal according to the sampled signals. The multiplexer 24 receives sampled signals and selects one sampled signal as an output signal according to the selection signal. Because the feedforward-based data recovery circuit 20 needs to over-sample the input signal, the multi-phase sampling clock signals with high frequency are needed to serve as the sampling clocks.

Larsson has disclosed a feedback phase selection clock recovery PLL in "A 2-1600-MHz CMOS Clock Recovery PLL with Low-Vdd Capability", IEEE Journal of Solid-State Circuits, Vol. 34, No. 12, published in December 1999, the contents of which are incorporated herein by reference, wherein the voltage controlled oscillation (VCO) loop and the data recovery loop are independent of each other. The advantage of the Larsson design is that the bandwidths of the two loops may be designed independently, and the abrupt phase switching phenomenon tends not to be seen during the phase selection. However, it has the drawback of failing to timely reach an optimal sampling phase longer tracking time for data recovery.

SUMMARY OF THE INVENTION

It is therefore an object of the invention to provide a clock generator capable of rendering shortened tracking time.

Another object of the invention is to provide a feedback-based data recovery circuit capable of resulting in shortened tracking time.

To achieve the above-identified objects, the invention discloses a data recovery circuit, which includes a voltage control oscillator for generating a sampling clock and a plurality of multi-phase clocks, a multiplexer for receiving the multi-phase clocks and selecting one of the multi-phase clocks to output according to a selection signal, a phase-frequency detector for receiving the output signal of the multiplexer and a reference clock and generating a phase-frequency error signal, a charge pump and loop filter for receiving the phase-frequency error signal and generating a control voltage, a phase detector for receiving the sampling clock and an input signal and generating a phase error signal, a digital low-pass filter for receiving the phase error signal and generating the selection signal, and a flip-flop for receiving the input signal, sampling the input signal according to the sampling clock and generating an output signal. When the digital low-pass filter generates the selection signal to force the multiplexer to change a different phase, the digital low-pass filter also clears an accumulated phase error itself.

To achieve the above-identified objects, the invention also discloses a clock generator for generating a sampling clock according to an input signal and a reference clock. The clock generator includes a voltage control oscillator for generating a sampling clock and a plurality of multi-phase clocks, a multiplexer for receiving the multi-phase clocks and selecting one of the multi-phase clocks to output according to a selection signal, a phase-frequency detector for receiving the output signal of the multiplexer and the reference clock and generating a phase-frequency error signal, a charge pump and loop filter for receiving the phase-frequency error signal and generating a control voltage, a phase detector for receiving the sampling clock and the input signal and generating a phase error signal, and a digital low-pass filter for receiving the phase error signal and generating the selection signal. When the digital low-pass filter generates the selection signal to force the multiplexer to change a phase, the digital low-pass filter clears an accumulated phase error itself.

To achieve the above-identified objects, the invention also discloses a data recovery circuit, which includes a voltage controlled oscillation loop and a data recovery loop. The voltage controlled oscillation loop receives a reference clock and generates a sampling clock. The voltage controlled oscillation loop includes a multi-phase voltage control oscillator for generating a plurality of clock signals with different phases and selecting one of the clock signals according to a selection signal. The data recovery loop generates the selection signal according to the sampling clock and an input signal. The data recovery loop includes a phase detector for generating a phase error signal according to the sampling clock and the input signal, and a digital low-pass filter for generating the selection signal according to the phase error signal. When the digital low-pass filter generates the selection signal to force the multi-phase voltage control oscillator to change a selected phase, the digital low-pass filter clears an accumulated phase error itself

DETAILED DESCRIPTION OF THE INVENTION

The clock generator and the data recovery circuit using the clock generator according to the embodiments of the invention will be described with reference to the accompanying drawings.

Figure 1:
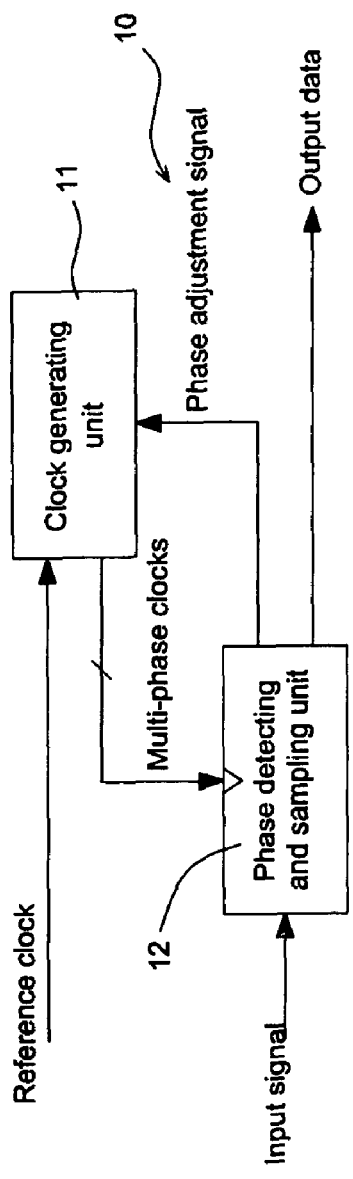
FIG. 1 shows the architecture of a feedback-based data recovery circuit.
Figure 2:
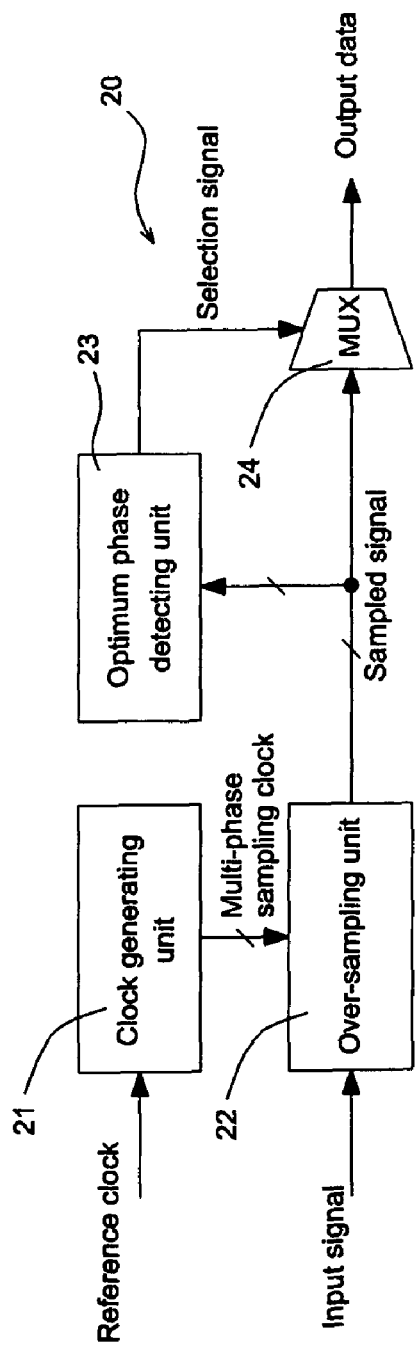
FIG. 2 shows the architecture of a feedforward-based data recovery circuit.
Figure 3:
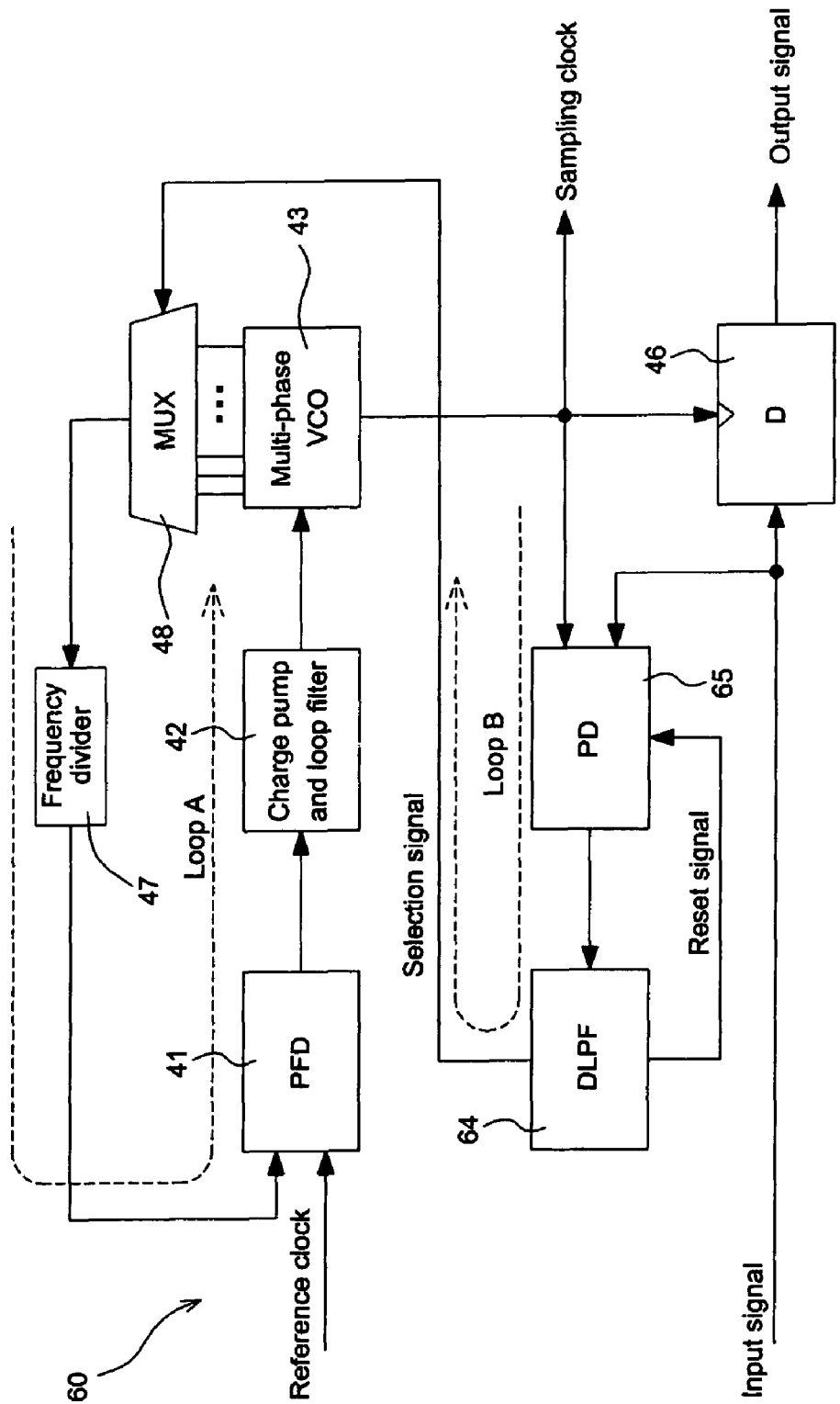
FIG. 3 shows a feedback-based data recovery circuit according to a first embodiment of the invention.

FIG. 3 shows a feedback-based data recovery circuit according to a first embodiment of the invention. Referring to FIG. 3, the recovery circuit 60 includes a voltage controlled oscillation loop (loop A in FIG. 3), a data recovery loop (loop B in FIG. 3), and a D-type flip-flop 46. The voltage controlled oscillation loop includes a phase-frequency detector (PFD) 41, a charge pump and loop filter 42, a multi-phase voltage controlled oscillator (multi-phase VCO) 43, a multiplexer 48, and a frequency divider 47. The data recovery loop (loop B in FIG. 3) includes a digital low-pass filter (DLPF) 64 and a phase detector (PD) 65. The implementation and realization of each of the elements in FIG. 3 is well known to those of ordinary skill in the art, and is as described in Larsson. Detailed descriptions are therefore herein omitted.

The digital low-pass filter 64 of the recovery circuit 60 has the function of resetting and clearing the values temporarily stored in the phase detector 65. In addition to generating the selection signal for the multiplexer 48, the digital low-pass filter 64 further generates a reset signal for the phase detector 65. In addition, the digital low-pass filter 64 resets and clears the accumulated phase error within itself each time when the digital low-pass filter 64 performs a phase adjustment (either the forward adjustment or the backward adjustment), i.e., when the selection signal is enabled. The details of implementing the digital low-pass filter 64 will be described in the following.

In addition, the phase detector 65 may also have the reset function. The so-called reset function means that the phase detector 65 completely clears and sets all the calculating intermediate data therein to default values (usually zeros), when it receives the reset signal outputted by the low-pass filter 64. For example, a phase detector implemented with pipeline architecture resets and clears all the data latched in each stage of the pipeline, when the phase detector receives the reset signal. The operation of using the reset signal to clear the data in the phase detector 65 and clear the accumulated phase error of the digital low-pass filter 64 in conjunction with the selection signal of the digital low-pass filter 64 enables the multiplexer 48 to adjust more than one phase at a time. Thus, the tracking speed can be increased, and the tracking time may be shortened.

Figure 4:
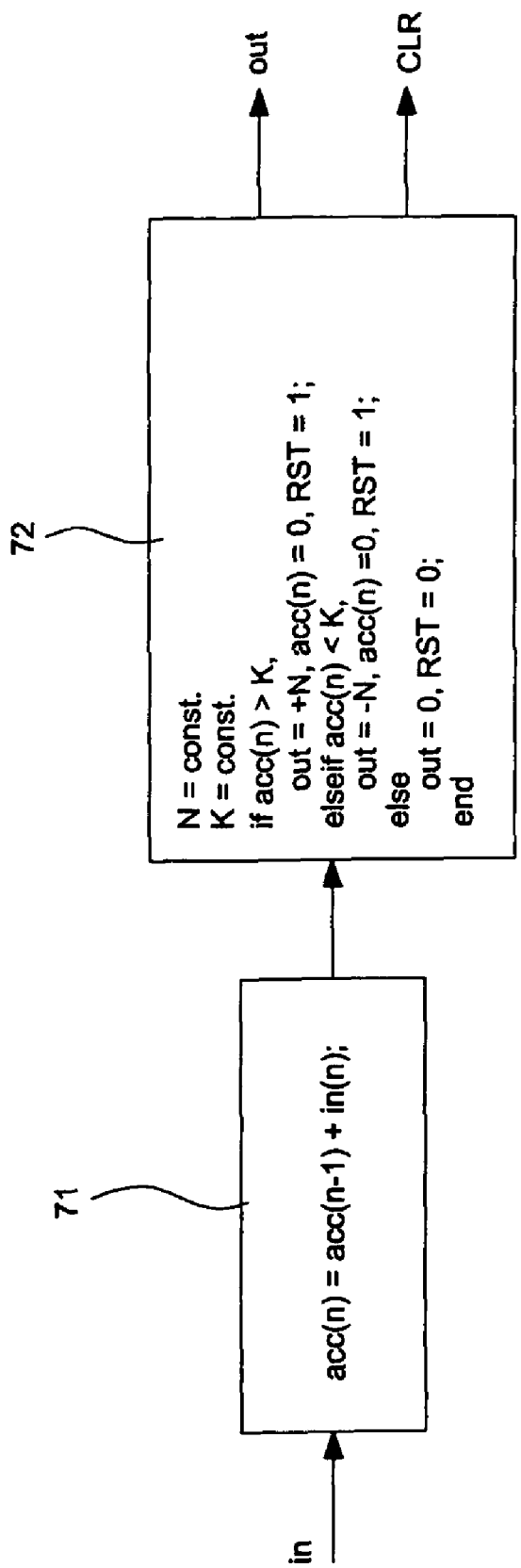
FIG. 4 shows an embodiment digital low-pass filter design of FIG. 3 using MATLAB code.

FIG. 4 shows an embodiment digital low-pass filter 64 of FIG. 3 using MATLAB code. In this embodiment, the signal labeled "out" represents the selection signal, the signal RST represents the reset signal, the parameter acc(n) represents the accumulated phase error, the parameter N represents the phase adjustment amount in each adjustment, and the parameter K represents a threshold phase difference. As shown in FIG. 4, the program is divided into two parts. The first part 71 is to generate the accumulated phase error acc(n), and the second part 72 is to generate and output the selection signal "out" and the reset signal RST according to the accumulated phase error acc(n).

The operation principle of the digital low-pass filter 64 will be described in the following. The digital low-pass filter 64 receives an output signal of the phase detector 65 as the input data "in", and generates the selection signal "out" and the reset signal RST. First, the system sets the values of the parameters. That is, the phase adjustment amount N and the threshold phase difference K are first set. Next, the digital low-pass filter 64 adds the input data "in" to the accumulated phase error acc(n) each time when it receives the input data "in". Then, the digital low-pass filter 64 sets the value of the selection signal "out" with the phase adjustment amount N for output, clears the accumulated phase error acc(n) to 0, and enables the reset signal RST when the accumulated phase error acc(n) is greater than the threshold phase difference K; or sets the value of the selection signal "out" with the phase adjustment amount −N for output, clears the accumulated phase error acc(n) to 0, and enables the reset signal RST when the accumulated phase error acc(n) is smaller than the threshold phase difference −K. If the accumulated phase error acc(n) ranges between the threshold phase differences K and −K, the selection signal "out" and the reset signal RST are both set to 0, and the accumulated phase error acc(n) is not cleared and is maintained.

Thus, after the digital low-pass filter 64 generates the selection signal "out", it clears the accumulated phase error acc(n) that is previously accumulated and enables the reset signal RST. So, the phase detector 65 clears and resets the data in the phase detector 65 after the enabling of the reset signal RST. Thus, the digital low-pass filter 64 accumulates the accumulated phase error acc(n) again each time when the phase is adjusted, such that the accumulated phase error acc(n), before the phase is adjusted, cannot influence the subsequent adjustment operation. Subsequently, a recovery circuit including a phase detector without the reset function according to another embodiment of the invention will be described in the following.

Figure 5:
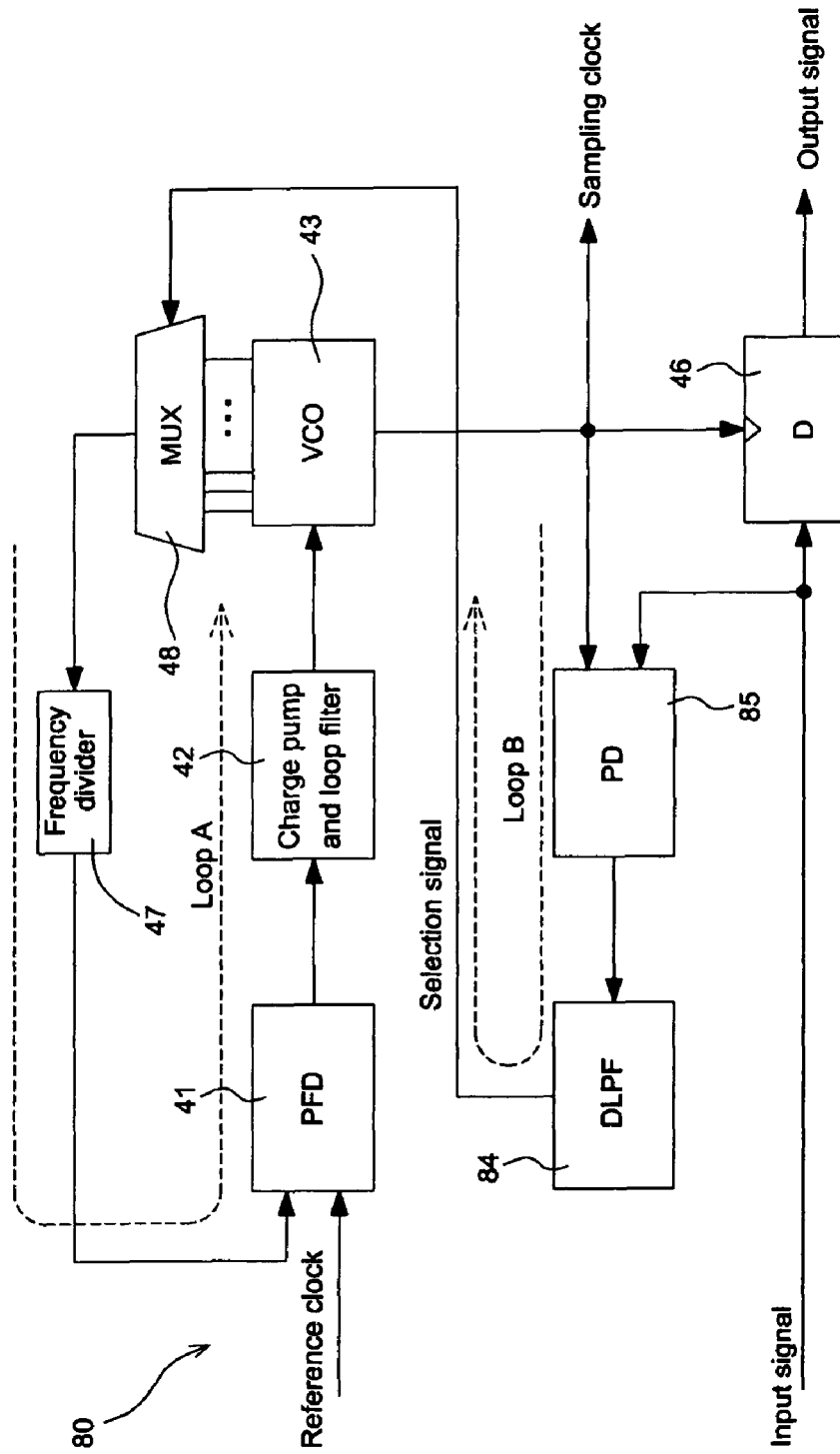
FIG. 5 shows a feedback-based data recovery circuit according to a second embodiment of the invention.

FIG. 5 shows a feedback-based data recovery circuit according to a second embodiment of the invention. As shown in FIG. 5, the recovery circuit 80 is similar to the recovery circuit 60 of FIG. 3 except that a phase detector 45 does not have the reset function and a digital low-pass filter 84 does not output the reset signal.

Figure 6:
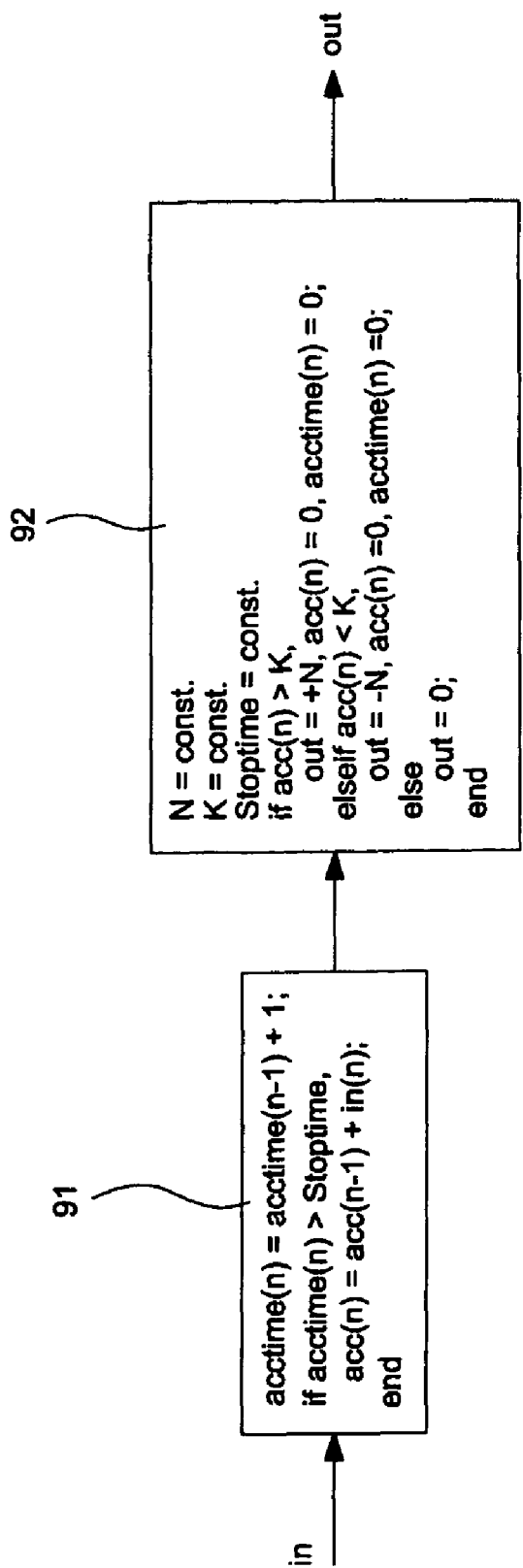
FIG. 6 shows an embodiment digital low-pass filter design of FIG. 5 using MATLAB code.

FIG. 6 shows an embodiment digital low-pass filter design 84 of FIG. 5 using MATLAB code. In this embodiment, the signal "out" represents the selection signal, the parameter acc(n) represents the accumulated phase error, the parameter acctime(n) represents the accumulated time, the parameter N represents the phase adjustment amount in each adjustment, the parameter K represents the threshold phase difference, and the parameter Stoptime represents the stop accumulating time. As shown in FIG. 6, the program is divided into two parts. The first part 91 starts to accumulate the accumulated phase error acc(n) after the accumulated time acctime(n) exceeds the stop accumulating time Stoptime, and the second part 92 generates the selection signal "out" according to the accumulated phase error acc(n).

The operation principle of the digital low-pass filter 84 will be described in the following. The digital low-pass filter 84 receives the output signal of the phase detector 45 as the input data "in" and generates the selection signal "out". First, the parameter values are set. That is, the phase adjustment amount N, the threshold phase difference K, and the stop accumulating time Stoptime are first set. Next, the digital low-pass filter 84 adds 1 to a time accumulated value acctime(n) each time when the digital low-pass filter 84 receives the input data "in", and the input data "in" is added to the accumulated phase error acc(n) only after the time accumulated value acctime(n) is greater than the stop accumulating time Stoptime. Then, the digital low-pass filter 84 sets the value of the selection signal "out" with the phase adjustment amount N, and the time accumulated value acctime(n) and the accumulated phase error acc(n) are cleared to 0, when accumulated phase error acc(n) is greater than the threshold phase difference K. Alternatively, when the accumulated phase error acc(n) is smaller than the threshold phase difference −K, the selection signal "out" is set as the phase adjustment amount −N, and the time accumulated value acctime(n) and the accumulated phase error acc(n) are cleared to 0. If the accumulated phase error acc(n) is between the threshold phase differences K and −K, the selection signal "out" is set as 0, and the time accumulated value acctime(n) and the accumulated phase error acc(n) are not cleared.

Thus, after the generation of the selection signal "out", besides of clearing the accumulated phase error acc(n), the digital low-pass filter 84 waits until the accumulating of the stop accumulating time Stoptime before again starting to accumulate the accumulated phase error. The reason why the digital low-pass filter 84 will wait until the accumulating of the stop accumulating time Stoptime before starting to accumulate the accumulated phase error is to skip the data remained in the phase detector 45 when the selection signal "out" with nonzero value is generated. The value of the stop accumulating time Stoptime is the time for the first data detected by the phase detector 45 to be transferred to the digital low-pass filter 84 when the selection signal "out" is nonzero (i.e., after the phase is adjusted). So, the phase detector 45 of the recovery circuit 80 does not have the reset function.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A data recovery circuit, comprising:
   a voltage control oscillator for generating a sampling clock and a plurality of multi-phase clocks;
   a multiplexer for receiving the multi-phase clocks and selecting one of the multi-phase clocks to generate a selected clock according to a selection signal;
   a phase detector for receiving the sampling clock and an input signal and generating a phase error signal; and
   a digital low-pass filter for receiving and accumulating the phase error signal and generating the selection signal,
   wherein when the accumulated phase error signal is less than a first threshold phase difference equal to −K, the digital low-pass filter is configured to set the selection signal to a first phase adjustment amount equal to −N and clear the accumulated phase error signal;
   wherein when the accumulated phase error signal is greater than a second threshold phase difference equal to K, the digital low-pass filter is configured to set the selection signal to a second phase adjustment amount equal to N and clear the accumulated phase error signal;
   wherein when the accumulated phase error signal ranges between the first and second threshold phase differences (−K and K), the digital low-pass filter is configured to set the selection signal to zero and maintain the accumulated phase error signal; and
   wherein the phase detector clears and set all calculating intermediate data therein to default values in response to a reset signal.

2. The data recovery circuit according to claim 1, further comprising a frequency divider disposed between the multiplexer and the phase-frequency detector.

3. The data recovery circuit according to claim 1, wherein the digital low-pass filter further outputs the reset signal to the phase detector.

4. The data recovery circuit according to claim 3, wherein the digital low-pass filter enables the reset signal after the selection signal is generated so as to clear data of the phase detector.

5. The data recovery circuit according to claim 1, wherein the digital low-pass filter starts to accumulate the accumulated phase error again after the accumulated time greater than a predetermined value.

6. A clock generator for generating a sampling clock according to an input signal and a reference clock, the clock generator comprising:
   a voltage control oscillator for generating a sampling clock and a plurality of multi-phase clocks;
   a multiplexer for receiving the multi-phase clocks and selecting one of the multi-phase clocks to generate a selected clock according to a selection signal;
   a phase detector for receiving the sampling clock and the input signal and generating a phase error signal; and
   a digital low-pass filter for receiving and accumulating the phase error signal and generating the selection signal,
   wherein the voltage control oscillator receives the control voltage to generate the sampling clock and the plurality of multi-phase clocks;
   wherein when the accumulated phase error signal is less than a first threshold phase difference equal to −K, the digital low-pass filter is configured to set the selection signal to a phase adjustment amount equal to −N and clear the accumulated phase error signal;
   wherein when the accumulated phase error signal is greater than a second threshold phase difference equal to K, the digital low-pass filter is configured to set the selection signal to a second phase adjustment amount equal to N and clear the accumulated phase error signal; and
   wherein when the accumulated phase error signal ranges between the first and second threshold phase differences (−K and K), the digital low-pass filter is configured to set the selection signal to zero and maintain the accumulated phase error signal.

7. The clock generator according to claim 6, further comprising a frequency divider disposed between the multiplexer and the phase-frequency detector.

8. The clock generator according to claim 6, the digital low-pass filter further outputs a clearing signal to the phase detector.

9. The clock generator according to claim 8, wherein the digital low-pass filter enables the clearing signal after the selection signal is generated, so as to clear data of the phase detector.

10. The clock generator according to claim 6, wherein the digital low-pass filter starts to accumulate the accumulated phase error again after the accumulated time greater than a predetermined value.

11. A data recovery circuit, comprising:
a voltage controlled oscillation loop for receiving a reference clock and generating a sampling clock; and
a data recovery loop for generating the selection signal according to the sampling clock and an input signal;
the voltage controlled oscillation loop comprising a multi-phase voltage control oscillator for generating a plurality of clock signals with different phases and selecting one of the clock signals according to a selection signal;
the data recovery loop comprising:
a phase detector for generating a phase error signal according to the sampling clock and the input signal;
and a digital low-pass filter for generating the selection signal according to the phase error signal;
wherein after the digital low-pass filter generates the selection signal to direct the multi-phase voltage control oscillator to change a selected phase, wherein when the accumulated phase error signal is less than a threshold phase difference equal to −K, the digital low-pass filter is configured to set the selection signal to a phase adjustment amount equal to −N and clear the accumulated phase error signal; wherein when the accumulated phase error signal is greater than a second threshold phase difference equal to K, the digital low-pass filter is configured to set the selection signal to a second phase adjustment amount equal to N and clear the accumulated phase error signal; and wherein when the accumulated phase error signal ranges between the first and second threshold phase differences (−K and K), the digital low-pass filter is configured to set the selection signal to zero and maintain the accumulated phase error signal.

12. The data recovery circuit according to claim 11, wherein the digital low-pass filter further outputs a clearing signal to the phase detector.

13. The data recovery circuit according to claim 12, wherein the digital low-pass filter enables the clearing signal after the selection signal is generated, so as to clear data of the phase detector.

14. The data recovery circuit according to claim 11, wherein the digital low-pass filter starts to accumulate the accumulated phase error again after the accumulated time greater than a predetermined value.

15. The data recovery circuit according to claim 1, wherein upon receiving the reset signal from the digital low-pass filter, the phase detector resets all intermediate data contained in the phase detector to default values.

16. The data recovery circuit according to claim 10, wherein the predetermined time represents a threshold time to stop accumulating time.

* * * * *